US005220286A

United States Patent [19]

Nadeem

[11] Patent Number: 5,220,286

[45] Date of Patent: Jun. 15, 1993

[54] SINGLE ENDED TO FULLY DIFFERENTIAL CONVERTERS

[75] Inventor: Shujaat Nadeem, Cambridge, Mass.

[73] Assignee: International Business Machines Corporation, Armonk, N.Y.

[21] Appl. No.: 956,822

[22] Filed: Oct. 5, 1992

Related U.S. Application Data

[63] Continuation of Ser. No. 722,774, Jun. 28, 1991, abandoned.

[51] Int. Cl.[5] .......... H03F 1/02

[52] U.S. Cl. .......... 330/9; 330/51

[58] Field of Search .......... 330/9, 51, 301, 275

[56] References Cited

U.S. PATENT DOCUMENTS

| | | | |
|---|---|---|---|
| 4,450,368 | 5/1984 | Spence | 330/9 |
| 4,453,130 | 6/1984 | Bennett | 330/51 |
| 4,574,250 | 3/1986 | Senderowicz | 330/258 |
| 4,641,105 | 2/1987 | Albaugh et al. | 330/9 |
| 4,862,121 | 8/1989 | Hochschild et al. | 333/173 |
| 4,896,156 | 1/1990 | Garverick | 341/143 |
| 5,049,831 | 9/1991 | Westwick | 330/107 |
| 5,070,305 | 12/1991 | Conjalonieri et al. | 330/301 |
| 5,142,238 | 8/1992 | White | 330/9 |

*Primary Examiner*—Robert J. Pascal
*Assistant Examiner*—Tan Dinh
*Attorney, Agent, or Firm*—J. Dennis Moore; Stephen J. Limanek

[57] ABSTRACT

A single to fully differential converter for fully differential switched capacitor circuits is provided which can be incorporated into a switched capacitor integrator architecture performing both conversion and integrating functions without affecting the performance of the fully differential integrator.

22 Claims, 2 Drawing Sheets

SINGLE ENDED TO FULLY DIFFERENTIAL CONVERTERS

This is a continuation of copending application Ser. No. 07/722,774 filed on Jun. 28, 1991 as now abandoned.

TECHNICAL FIELD

This invention relates to a single ended to fully differential conversion scheme incorporated into a fully differential switched capacitor integrator architecture resulting in an input to this architecture having a single ended signal instead of the heretofore required balanced fully differential input signal.

BACKGROUND ART

In recent years considerable interest has been shown in combining analog and digital circuits on a single semiconductor chip with particular importance to complementary metal oxide semiconductor (CMOS) analog circuits having very high performance, as required in analog to digital converters. The lack of desirable resistors in CMOS technology has led to increased development in switched capacitor techniques for replacing filters that have been conventionally constructed using discrete resistors, capacitors and inductors. In switched capacitor circuits resistors are replaced by switches and capacitors.

In the analog circuit technology two of the most important circuits are the analog to digital (A/D) converters and analog filters. Both of these types of circuits use a large number of switched capacitor circuits. For example, oversampled analog to digital converters have recently been found to be very useful in achieving high resolution conversion for low frequency signals. The oversampled A/D converters are inherently nonlinear systems which operate on the principle of oversampling and noise averaging. The principal building block of these systems is a fully differential switched capacitor integrator block. This fully differential switched capacitor integrator block is also the main building block of the switched capacitor filters.

In order to achieve high resolution, it is important to minimize noise contribution from power supplies and charge injection from switches. Since fully differential systems are inherently immune to supply noise and achieve a high common mode rejection ratio most high resolution switched capacitor applications use fully differential architecture. However, fully differential architectures require fully differential high gain amplifiers.

High gain fully differential amplifiers require common mode feedback circuitry to maintain the common mode level of output at a predetermined level. Thus, systems using common mode feedback circuitry require that the input differential signal be such that each of the input terminals for a fully differential system have signals applied thereto and these signals should be such that the signal $V_{IN}^+$ on the first of two input terminals be equal to the signal $-V_{IN}^-$ on the second of the two input terminals. For instance, if the input signal $V_{diff}$ is a sine wave, then when the first half of the sine wave cycle is positive as applied to the first input terminal, the second input terminal should have a sine wave applied thereto with its first half being negative. Accordingly, the input signal $$V_{IN}=V_{IN}^+-V_{IN}^-,$$

$$V_{IN}^+=V_{cm}+V_{diff}/2$$

$$V_{IN}^-=V_{cm}-V_{diff}/2, \text{ such that}$$

$$V_{diff}=V_{IN}=V_{IN}^+-V_{IN}^-, \text{ and}$$

$$V_{cm}=\text{common mode}=(V_{IN}^++V_{IN}^-)/2.$$

The use of switched capacitor circuits with differential amplifiers is disclosed in U.S. Pat. No. 4,896,156, filed on Oct. 3, 1988, No. 4,862,121, filed on Aug. 13, 1987, and U.S. Pat. No. 4,574,250, filed on Oct. 13, 1981.

The use of fully differential architectures in designing the high resolution A/D converters and filters provides very desirable results but it also provides the requirement that the input to these systems be a balanced signal around the common mode point of the system. This requirement is generally not compatible in systems where these parts are used. Thus, the choices normally available to the designer using these parts is to design signal conditioning circuitry to precede the high resolution converter on the board. This arrangement requires additional discrete components and very low noise and low distortion design of the signal conditioning circuit block which receives a single ended signal and provides a fully balanced output signal. Such a requirement not only drives the cost up but also places a very difficult requirement on the board designer who wants to design a 16-bit circuit if a 16-bit A/D converter has to be used. Thus, in view of the above mentioned issues, it becomes very important that the input to these high resolution systems be a single ended signal.

DISCLOSURE OF THE INVENTION

It is an object of this invention to provide a single ended to fully differential conversion scheme which can be incorporated into an architecture of a fully differential switched capacitor integrator without affecting the functionality of an integrator block, this block being the first block in a system such that it can perform single ended to fully differential conversion and integration simultaneously, and, if required, the block can also act only as a single ended to fully differential conversion block with scalable gain.

In accordance with the teachings of this invention, a single ended to fully differential converter is provided which has a single ended input signal and differential output signals, with the output signals applied directly to both first and second inputs of a differential amplifier using appropriate non-overlapping clock pulses to a plurality of switches, e.g., CMOS transistors, to couple the single ended input signal through a first capacitor to the first input of the differential amplifier and through a second capacitor to the second input of the differential amplifier. More specifically, the single ended input signal is applied across the first capacitor during a first period of time and to the second input of the differential amplifier during a second period of time through the second capacitor with the stored signal in the first capacitor also being applied to the first input of the differential amplifier during the second period of time.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
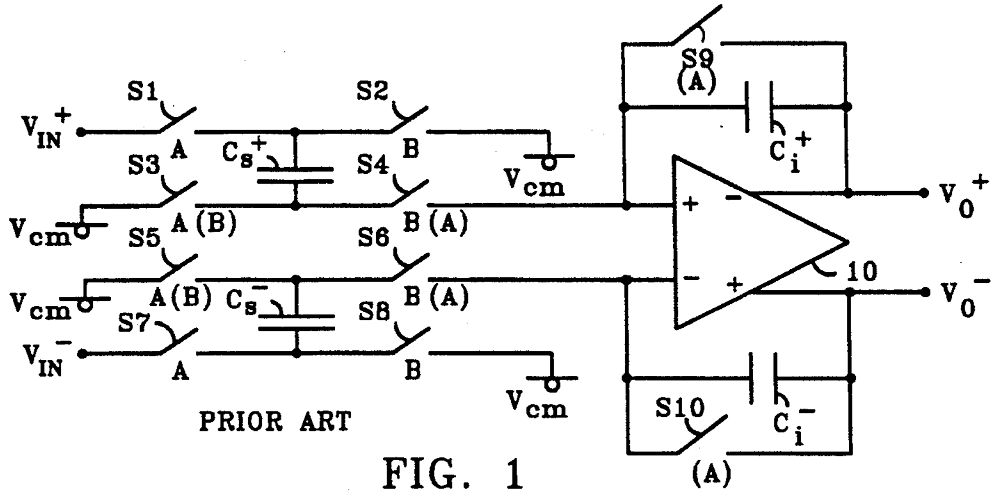
FIG. 1 is a circuit diagram of a fully differential switched capacitor integrator or summation block known in the prior art.

In order to more fully understand the teachings of the present invention, a basic fully differential integrator block, somewhat similar to that disclosed in the hereinabove cited U.S. Pat. No. 4,862,121, is illustrated in FIG. 1 of the drawings and discussed hereinbelow. The fully differential integrator block shown in FIG. 1 of the drawings is one of the most commonly used switched capacitor circuit designs. With the switches S9 and S10 open, this block acts as an integrator. This block may also be used as a gain element and as a summation block. Thus, this block forms the heart of many switched capacitor circuits.

Figure 3:
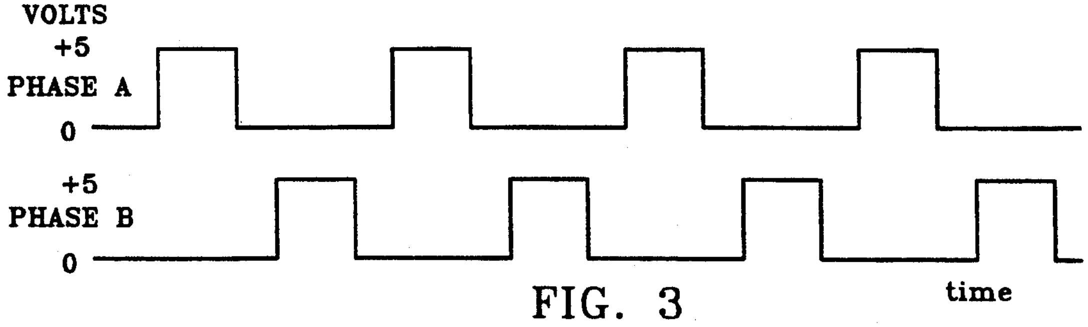
FIG. 3 is a graph indicating the clock pulses applied to the circuit of the invention illustrated in FIG. 2.

Using the block of FIG. 1 as an integrator with switches S9 and S10 open, it can be seen that on clock phase A, as indicated in FIG. 3 of the drawings, an input signal $V_{IN}+$ is sampled across capacitor $C_s+$ with switches S1 and S3 closed and input signal $V_{IN}-$ is sampled across capacitor $C_s-$ with switches S5 and S7 closed. On non-overlapping clock phase B the charge on capacitors $C_s+$ and $C_s-$ is transferred to integrating capacitors $C_i+$ and $C_i-$, respectively, with switches S2, S4, S6 and S8 closed.

The switched capacitor integrator block shown in FIG. 1 is a sampled data system and, thus, the Z-transform of the system function of this block with the clocking scheme indicated is $$H(Z)=C_sZ^{-1}/C_i(1-Z^{-1}).$$

This arrangement performs the integration function with a positive gain and a unit delay. This same architecture when operated with a modified clocking scheme can perform the integration function with a negative gain and no delay. This modified clocking scheme is also indicated in FIG. 1 of the drawings wherein switches S3 and S5 are controlled by clock phase B (shown in parenthesis) instead of by clock phase A and switches S4 and S6 are controlled by clock phase A (shown in parenthesis) instead of clock phase B, with the other switches being controlled as indicated in FIG. 1. The Z-transform of this system using the modified clocking scheme is $$H(Z)=-C_s/C_i(1-Z^{-1}).$$

This same architecture can be used as a simple gain block. When the clock signals are applied as specified for the integrator with a positive gain and a delay, clock phase A is applied to switches S9 and S10 of FIG. 1. Accordingly, when the input capacitor $C_s$ is being charged up with the input voltage $V_{IN}$, at the same time the switches S9 and S10 are on across the capacitors $C_i+$ and $C_i-$ so that these capacitors will be discharged.

Thus, on clock phase B when the charge from the capacitor $C_s$ is transferred to the capacitor $C_i$ the output is simply a scaled version of the input signal, i.e., $$V_O/V_{IN}=C_s/C_iZ^{-1}.$$

As indicated in FIG. 1, the input to the switched capacitor integrator block shown therein is a fully differential signal. Although the prior art circuit of FIG. 1 functions very satisfactorily, it does require a fully differential input signal, which as mentioned hereinabove requires the use of a single ended signal generator coupled to an off-chip signal conditioning circuit having a differential output and coupling the output of the signal conditioning circuit to an on-chip fully differential amplifier.

Figure 2:
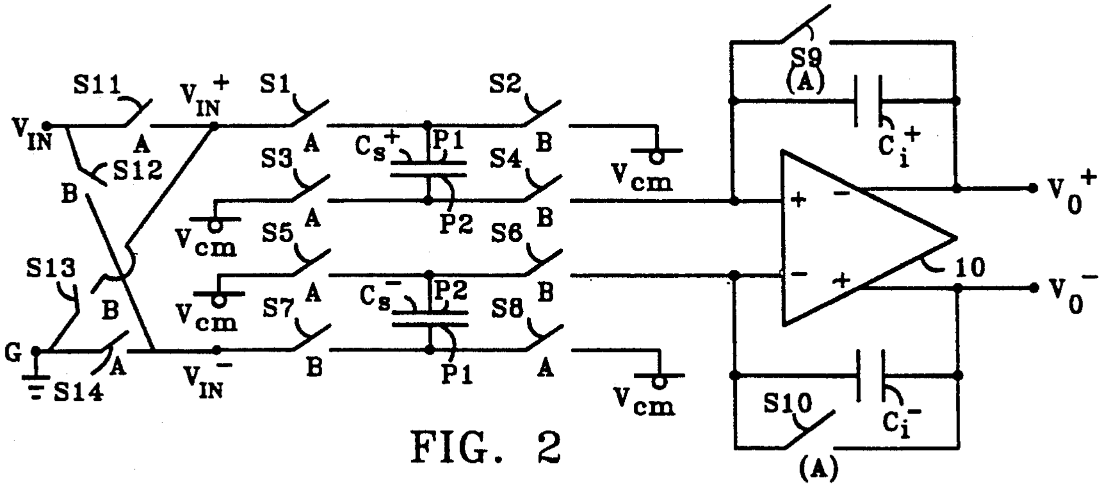
FIG. 2 is a circuit diagram of a preferred embodiment of the present invention.

FIG. 2 of the drawings illustrates an architecture of a single ended to fully differential converter circuit incorporated into an integrator architecture having the addition of only four switches and a novel clocking scheme to provide single ended to fully differential conversion, in accordance with the teachings of the present invention. The converter shown in FIG. 2 does not require the use of a complex noise-generating off-chip signal conditioning circuit.

Referring to FIG. 2 of the drawings in more detail, it can be seen that the single ended to fully differential converter includes an integrating fully differential amplifier 10 having input terminals + and − and output terminals − and + and a first integrating capacitor $C_i+$ connected between the output terminal − and the input terminal + of the amplifier 10, as well as a second integrating capacitor $C_i-$ connected between the output terminal + and the input terminal − of the amplifier 10. Output terminals of the single ended to fully differential converter are indicated at $V_O+$ connected to the output terminal − of the amplifier 10 and at $V_O-$ connected to the output terminal + of the amplifier 10.

A single ended input signal terminal $V_{IN}$ is coupled to a first differential signal terminal $V_{IN}+$ through a switch S11 and to a second differential signal terminal $V_{IN}-$ through a switch S12. A point of reference potential such as a ground terminal G is coupled to the first differential signal terminal $V_{IN}+$ through a switch S13 and to the second differential signal terminal $V_{IN}+$ through a switch S14. A switch S1 is connected between the first differential signal terminal $V_{IN}+$ and a first plate P1 of a first storage capacitor $C_s+$ and a switch S2 is connected between the first plate P1 of the first storage capacitor $C_s+$ and a common mode voltage terminal $V_{cm}$. A switch S3 is connected between a second plate P2 of the first storage capacitor $C_s+$ and the common mode voltage terminal $V_{cm}$ and a switch S4 connects the second plate P2 of the first storage capacitor $C_s+$ to the first input terminal + of the amplifier 10. A switch S7 is connected between the second differential signal terminal $V_{IN}-$ and a first plate P1 of a second storage capacitor $C_s-$ and a switch S8 is connected between the first plate P1 of the second storage capacitor $C_s-$ and the common mode voltage terminal $V_{cm}$. A switch S5 is connected between a second plate P2 of the second storage capacitor $C_s-$ and the common mode voltage terminal $V_{cm}$ and a switch S6 connects the second plate P2 of the second storage capacitor $C_s-$ to the second input terminal − of the amplifier 10. Additionally, switches S9 and S10 connected across integrating capacitors $C_i+$ and $C_i-$, respectively, may be included and driven by clock pulse phase A when it is desired to remove the integrating function from the circuit of FIG. 2 to provide a simple single ended to fully differential conversion block, with the capacitance of the capacitors $C_s$ and $C_i$ having the same values.

To better understand the operation of the circuit of the present invention illustrated in FIG. 2 reference may be had to the non-overlapping clock pulses, phase A and phase B, indicated in FIG. 3 of the drawings, which operate the switches S1-S8 and S11-S14 of the single ended to fully differential converter shown in FIG. 2. During the clock pulse phase A, which may, e.g., have a voltage magnitude of 5 volts and be equal to that of the voltage supply of the circuit, the switches S11, S1 and S3 are closed to sample the input voltage $V_{IN}$ applied to the first differential input terminal $V_{IN}+$ and across the first storage capacitor $C_s+$. Switches S5, S8 and S14 are also closed during the clock pulse phase A to discharge the plates P1 and P2 of the second storage capacitor $C_s-$ and to ground the second differential input terminal $V_{IN}-$. During the clock pulse phase B, which does not overlap in time clock pulse phase A and which may have a voltage magnitude similar to that of clock pulse phase A, the switches S12, S7 and S6 are closed to apply a sample voltage to the input terminal − of the amplifier 10 through the second differential input terminal $V_{IN}-$ and the second storage capacitor $C_s-$, while switch 13 grounds the first differential input terminal $V_{IN}+$. Also during the clock pulse phase B the switches S2 and S4 are closed to apply the charge stored in the storage capacitor $C_s+$ during the clock pulse phase A to the input terminal + of the amplifier 10. Thus, during the clock pulse phase B the signals at both the first and second differential input terminals $V_{IN}+$ and $V_{IN}-$ are simultaneously applied to the input terminals + and −, respectively, of the amplifier 10. It should be understood that the frequency of the input signal or sine wave at $V_{IN}$ is significantly lower than the frequency of the clock pulses, with the clock pulses having a frequency of one megahertz or higher, if desired. Accordingly, it can be seen that fully differential signals $V_{IN}+$ and $V_{IN}-$ have been applied to the differential amplifier 10 from the singled ended signal $V_{IN}$ without resorting to the use of costly, noise generating off-chip signal conditioning circuits. It should be noted that the single ended to fully differential converter of the present invention shown in FIG. 2 of the drawings has been produced by merely adding four switches to the integrator illustrated in FIG. 1 and altering the control of switches by the clock pulses. The circuit block of the present invention shown in FIG. 2 performs the single to fully differential conversion without affecting its operation as an integrator.

Of course, as mentioned hereinabove in connection with the circuit of FIG. 1 of the drawings, the block of FIG. 2 can be used simply as a gain block or a simple single ended to fully differential conversion block by applying clock phase A to switches S9 and S10 to discharge the capacitors $C_i+$ and $C_i-$ during clock phase A, with the ratio of the capacitance of the capacitors $C_s/C_i$ being used to scale the signal amplitude.

The following relationships in the circuit of the present invention shown in FIG. 2 of the drawings should be noted:

$$V_O^+/V_{IN}^+ = C_s^+ Z^{-1}/C_i^+(1-Z^{-1})$$

$$V_O^-/V_{IN}^- = -Z^{-1}C_s^-/C_i^-(1-Z^{-1}),$$

therefore, $$V_O^+ = C_s^+(V_{cm}+V_{IN})Z^{-1}/C_i^+(1-Z^{-1})$$

$$V_O^- = C_s^-(V_{cm}-V_{IN})Z^{-1}/C_i^-(1-Z^{-1}).$$

Thus, it can be seen that the output signals $V_O+$ and $V_O-$ satisfy the requirement of a fully differential signal, i.e., $$(V_O^+ + V_O^-)/2 = V_{cm}, \text{ and}$$

$$V_O^+ - V_O^- = 2V_{IN}.$$

The factor of 2 can be cancelled by scaling the capacitor ratio $C_s/C_i$, or any other scale factor can be achieved by simply scaling the $C_s/C_i$ ratio.

Accordingly, it can be seen that the present invention discloses a circuit having a single ended input signal with an output signal balanced about the common mode level of a fully differential circuit.

Thus, it can be readily seen that the switching scheme taught in FIG. 2 of the drawings performs a simple and inexpensive single ended to fully differential conversion on a single semiconductor chip without adversely affecting the function of any fully differential system requiring a fully differential input.

It can also be seen that the present invention improves noise performance by eliminating off-chip circuitry which often includes two amplifiers and other discrete components. It should also be noted that the circuit of the present invention saves surface area on a semiconductor chip since only four switches are added to the basic fully differential integrator block illustrated in FIG. 1 of the drawings to provide the conversion from a single ended signal to a fully differential signal.

Figure 4:
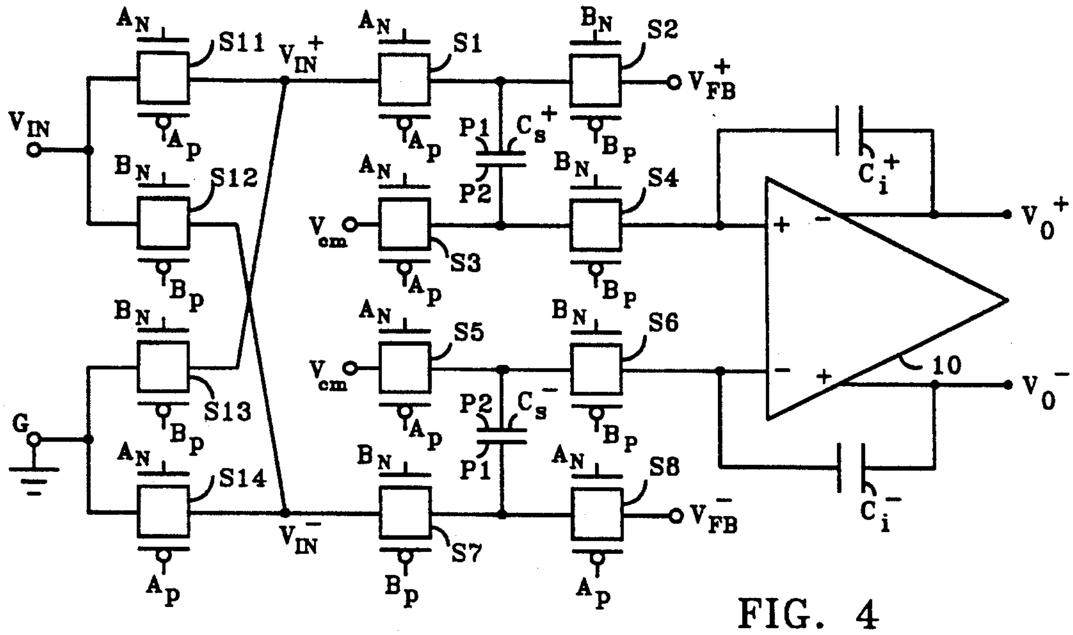
FIG. 4 is a circuit diagram of a preferred embodiment of the invention made in the CMOS technology.

FIG. 4 of the drawings illustrates a preferred circuit diagram of a single ended to fully differential converter of the present invention made in the CMOS technology. This circuit is somewhat similar to the circuit of the present invention shown in FIG. 2 of the drawings with similar elements in FIGS. 2 and 4 having the same reference characters. The circuit of FIG. 4 differs from that of FIG. 2 of the drawings in that the switches 1-8 and 11-14 are indicated as being transmission gates, each of which includes an N-channel field effect transistor connected in parallel with a P-channel field effect transistor. The circuit of FIG. 4 also differs from the circuit in FIG. 2 of the drawings in that the common mode terminal $V_{cm}$ connected to the switches S2 and S8 in FIG. 2 have been replaced by feedback terminals $V_{FB}+$ and $V_{FB}-$, respectively, so that, if desired, any feedback signal may be applied to these feedback terminals to subtract a feedback signal from the input signal. Also, if desired, the switches S1-S8 and S11-S14, instead of being transmission gates each of which has both N-channel and P-channel field effect transistors parallelly arranged, may consist of only a single field effect transistor of either the N-channel or P-channel type. However, as is known, the use of transmission gates is generally preferred since they provide a very low resistance path which makes full supply voltage swings available in the circuit.

Figure 5:
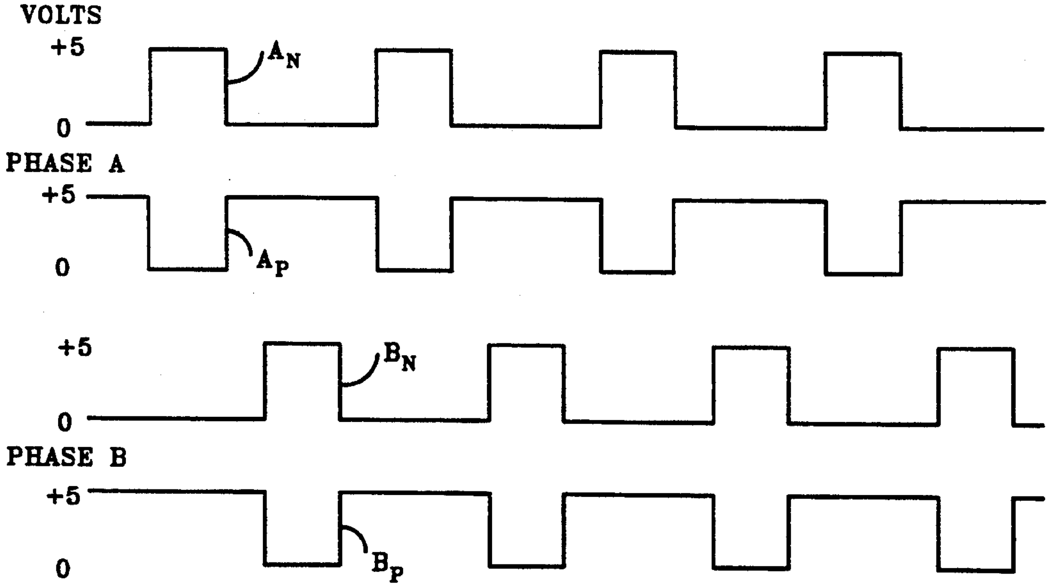
FIG. 5 is a graph indicating the clock pulses applied to the circuit of the invention illustrated in FIG. 4.

The single ended to fully differential converter of FIG. 4 operates in a very similar manner to that of the circuit of FIG. 2 except that appropriate clock pulse voltages must be applied to the transmission gates S1–S8 and S11–S14 so as to simultaneously turn on both the N-channel and P-channel field effect transistors. Accordingly, as seen in FIG. 5 of the drawings, during phase A a first voltage $A_N$ has a positive voltage of, e.g., 5 volts, to turn on the appropriate N-channel field effect transistors while simultaneously a second voltage $A_P$ is at, e.g., 0 volts to turn on the corresponding P-channel field effect transistors. Likewise, during phase B a first voltage $B_N$ has a positive voltage of 5 volts to turn on the appropriate N-channel field effect transistors while simultaneously a second voltage $B_P$ is at approximately 0 volts to turn on corresponding P-channel field effect transistors.

It can be readily seen that since, in accordance with the teachings of this invention, the converter requires only CMOS transistors, or, if preferred, single metal oxide semiconductor (MOS) transistors, for the switches, along with capacitors which, as is known, are readily made from transistors by interconnecting the current carrying electrodes or source and drain terminals, an entire high gain fully differential amplifier having common mode feedback circuitry can be made on a single semiconductor chip at less cost, with less noise and in less space.

While the invention has been particularly shown and described with reference to preferred embodiments thereof, it will be understood by those skilled in the art that various changes in form and details may be made therein without departing from the spirit and scope of the invention.

What is claimed is:

1. A single ended to fully differential converter circuit incorporated into a switched capacitor integrator architecture comprising a differential amplifier having a first capacitor connected between a first output and a first input thereof and a second capacitor connected between a second output and a second input thereof, a single ended input port, a third capacitor having a first plate connected to said single ended input port through first and second switches and to a common mode terminal through a third switch and a second plate connected to the common mode terminal through a fourth switch and to the first input of said differential amplifier through a fifth switch, a fourth capacitor having a first plate connected to a point of reference potential through sixth and seventh switches and to the common mode terminal through an eighth switch and a second plate connected to the common mode terminal through a ninth switch and to the second input of said differential amplifier through a tenth switch, an eleventh switch connected from said single ended input port to a common point between said sixth and seventh switches, a twelfth switch connected from said point of reference potential to a common point between said first and second switches, and means including first and second non-overlapping clock pulses for controlling said switches.

2. a single ended to fully differential converter circuit incorporated into a switched capacitor integrator architecture as set forth in claim 1 wherein said switches are transistors.

3. A single ended to fully differential converter circuit incorporated into a switched capacitor integrator architecture as set forth in claim 2 wherein said transistors are field effect transistors.

4. A single ended to fully differential converter circuit incorporated into a switched capacitor integrator architecture as set forth in claim 1 wherein said switches are transmission gates.

5. A single ended to fully differential converter circuit incorporated into a switched capacitor integrator architecture as set forth in claim 4 wherein each of said transmission gates includes an N-channel field effect transistor and a P-channel field effect transistor connected in parallel with said N-channel field effect transistor.

6. A single ended to fully differential converter circuit incorporated into a switched capacitor integrator architecture as set forth in claim 1 wherein said first clock pulse controls said first, second, fourth, sixth, eighth and ninth switches and said second clock pulse controls said third, fifth, seventh, tenth, eleventh and twelfth switches.

7. A single ended to fully differential circuit comprising a differential amplifier having first and second input terminals and first and second output terminals, a single ended input terminal, first and second capacitors, first switching means for coupling said first capacitor between said single ended input terminal and a common mode node during a first period of time, and second switching means for coupling said first capacitor between said common mode node and the first input terminal of said differential amplifier and for simultaneously coupling said single ended input terminal to the second input terminal of said differential amplifier through said second capacitor during a second period of time subsequent to said first period of time.

8. A single ended to fully differential circuit as set forth in claim 7 wherein said first switching means includes a first clock pulse and said second switching means includes a second clock pulse non-overlapping with respect to said first clock pulse.

9. A single ended to fully differential circuit as set forth in claim 8 wherein said first switching means further includes a first plurality of switches controlled by said first clock pulse and said second switching means further includes a second plurality of switches controlled by said second clock pulse.

10. A single ended to fully differential circuit as set forth in claim 9 wherein said switches are field effect transistors.

11. A single ended to fully differential circuit as set forth in claim 9 wherein said switches are transmission gates.

12. A single ended to fully differential circuit as set forth in claim 11 wherein each of said transmission gates includes an N-channel field effect transistor and a P-channel field effect transistor connected in parallel with said N-channel field effect transistor.

13. A single ended to fully differential circuit as set forth in claim 12 wherein said N-channel field effect transistors and said P-channel field effect transistors are controlled by said first and second non-overlapping clock pulses.

14. A single ended to fully differential converter comprising a single ended input terminal, first and second output terminals, first and second capacitors, first, second and third serially arranged switches connected between said single ended input terminal and a common mode node, fourth and fifth serially arranged switches connected between the common mode node and said first output terminal, sixth and seventh serially arranged switches connected between said common mode node and said second output terminal, eighth, ninth and tenth serially arranged switches connected between a point of reference potential and said common mode node, a first capacitor connected from a common point between said second and third switches to a common point between said fourth and fifth switches, a second capacitor connected from a common point between said ninth and tenth switches to a common point between said sixth and seventh switches, an eleventh switch connected from said single ended input terminal to a common point between said eighth and ninth switches, a twelfth switch connected from said point of reference potential to a common point between said first and second switches, and means for controlling said first, second, fourth, sixth, eighth and tenth switches during a first period of time and for controlling said third, fifth, seventh, ninth, eleventh and twelfth switches during a second period of time subsequent to said first period of time.

15. A single ended to fully differential converter as set forth in claim 14 wherein said means includes first and second clock pulses applied to said switches during said first and second periods of time, respectively.

16. A single ended to fully differential converter as set forth in claim 15 wherein said switches are transmission gates including an N-channel field effect transistor and a P-channel field effect transistor.

17. A single ended to fully differential switched capacitor integrator circuit comprising an input terminal, a point of reference potential, a differential amplifier including first and second input terminals and first and second output terminals and having a first capacitor connected between the first output terminal and the first input terminal thereof and a second capacitor connected between the second output terminal and the second input terminal thereof, first, second and third transmission gates serially connected between said input terminal and a first feedback terminal, fourth and fifth transmission gates serially connected between the first input terminal of said differential amplifier and a common mode node, sixth and seventh transmission gates serially connected between the second input terminal of said differential amplifier and said common mode node, eighth, ninth and tenth transmission gates serially connected between said point of reference potential and a second feedback terminal, a third capacitor connected from a common point between said second and third transmission gates to a common point between said fourth and fifth transmission gates, a fourth capacitor connected from a common point between said sixth and seventh transmission gates to a common point between said ninth and tenth transmission gates, an eleventh transmission gate connected from said input terminal to a common point between said eighth and ninth transmission gates, a twelfth transmission gate connected from said point of reference potential to a common point between said first and second transmission gates, and means for controlling said first, second, fourth, sixth, eighth and tenth transmission gates during a first period of time and said third, fifth, seventh, ninth, eleventh and twelfth transmission gates during a second period of time subsequent to said first period of time.

18. A single ended to fully differential switched capacitor integrator circuit as set forth in claim 17 wherein each of said transmission gates includes an N-channel field effect transistor and a P-channel field effect transistor connected in parallel with said N-channel field effect transistor and said means includes first and second clock pulses selectively applied to said transistors during said first and second periods of time, respectively.

19. A single ended to fully differential circuit comprising a differential amplifier having first and second capacitors connected between a negative output and a positive input and a positive output and a negative input thereof, respectively, a single ended input port, a first clock signal and a second clock signal, being of the same frequency and opposite phase, and third and fourth capacitors being connected by way of a first terminal of each to respective inputs of said differential amplifier by way of respective first and second switches activated by said second clock signal, said first terminals also being connected to ground by way of respective third and fourth switches activated by said first signal, said third and fourth capacitors having their second terminals connected to ground by way of fifth and sixth switches activated by said first clock signal and said second clock signal, respectively, said second terminal of said third capacitor being also connected through seventh and eighth switches, respectively, activated by said first clock signal, to the circuit input, and through said seventh switch and a ninth switch activated by said second clock signal to the circuit ground, and said second terminal of said fourth capacitor being also connected through tenth and eleventh switches, respectively, activated by said second clock signal and by said first clock signal, respectively, to the circuit ground, and through said tenth switch and a twelfth switch activated by said second clock signal to the circuit input.

20. A single ended to fully differential circuit as set forth in claim 19 further including thirteenth and fourteenth switches connected across said first and second capacitors, respectively, controlled by one of said clock signals.

21. A single ended to fully differential circuit as set forth in claim 20 wherein said thirteenth and fourteenth switches are controlled by said first clock signal.

22. A single ended to fully differential circuit comprising first and second output terminals, a single ended input terminal, first and second capacitors, first switching means for coupling said first capacitor between said single ended input terminal and a common mode node during a first period of time, and second switching means for coupling said single ended input terminal to said second output terminal through said second capacitor and for simultaneously coupling said first capacitor between said common mode node and said first output terminal during a second period of time.

* * * * *